(12) United States Patent
Signamarcheix et al.

(10) Patent No.: US 9,997,394 B2
(45) Date of Patent: Jun. 12, 2018

(54) METHOD FOR TRANSFERRING A THIN LAYER WITH SUPPLY OF HEAT ENERGY TO A FRAGILE ZONE VIA AN INDUCTIVE LAYER

(71) Applicant: Commissariat a l'energie atomique et aux energies alternatives, Paris (FR)

(72) Inventors: Thomas Signamarcheix, Grenoble (FR); Emmanuel Augendre, Montbonnot (FR); Lamine Benaissa, Massy (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days. days.

(21) Appl. No.: 14/901,027

(22) PCT Filed: Jun. 27, 2014

(86) PCT No.: PCT/EP2014/063665
§ 371 (c)(1),
(2) Date: Dec. 28, 2015

(87) PCT Pub. No.: WO2014/207184
PCT Pub. Date: Dec. 31, 2014

(65) Prior Publication Data
US 2016/0372362 A1     Dec. 22, 2016

(30) Foreign Application Priority Data

Jun. 27, 2013  (FR) ...................................... 13 56213

(51) Int. Cl.
*H01L 21/30*     (2006.01)
*H01L 21/46*     (2006.01)
(Continued)

(52) U.S. Cl.
CPC ...... *H01L 21/76254* (2013.01); *H01L 21/428* (2013.01); *H01L 24/83* (2013.01);
(Continued)

(58) Field of Classification Search
CPC ......... H01L 21/76; H01L 21/42; H01L 21/46; H01L 21/30
(Continued)

(56) References Cited

U.S. PATENT DOCUMENTS 5,616,423 A * 4/1997 Sanjyou .................. B32B 15/01
                                                           428/632
5,814,880 A * 9/1998 Costello ................ H01L 23/057
                                                           257/678
(Continued)

FOREIGN PATENT DOCUMENTS

EP        2 468 931 A1      6/2012

OTHER PUBLICATIONS

U.S. Appl. No. 14/893,396, filed Nov. 23, 2015, Bruno Imbert, et al.
(Continued)

*Primary Examiner* — Sheikh Maruf
(74) *Attorney, Agent, or Firm* — Oblon, McClelland, Maier & Neustadt, L.L.P.

(57) ABSTRACT

A method of transferring a thin layer from a first substrate to a second substrate with different coefficients of thermal expansion, including: providing at least one intermediate layer which temperature is increased by induction when an electromagnetic field is applied to it, more than a temperature increase in the first and second substrates; making contact between the first substrate and the second substrate, with the at least one intermediate layer interposed between them; fracturing the first substrate at a weakened zone making use of supply of thermal energy at the weakened zone made by applying an electromagnetic field to a het-
(Continued)

erostructure formed by making contact between the first substrate and the second substrate, the application generating local induction heating in the intermediate layer that induces a temperature gradient with a local value at the weakened zone activating the fracture mechanism.

14 Claims, 3 Drawing Sheets

(51) Int. Cl.
*H01L 21/762* (2006.01)
*H01L 21/428* (2006.01)
*H01L 23/00* (2006.01)

(52) U.S. Cl.
CPC ............... *H01L 2224/29147* (2013.01); *H01L 2224/83895* (2013.01)

(58) Field of Classification Search
USPC .................. 438/455–459; 257/618, E21.211, 257/E21.324
See application file for complete search history.

(56) References Cited

U.S. PATENT DOCUMENTS

| | | | | |
|---|---|---|---|---|
| 6,517,744 B1* | 2/2003 | Hara | ..................... | B29C 70/025 148/108 |
| 8,293,620 B2 | 10/2012 | Signamarcheix et al. | | |
| 8,853,785 B2 | 10/2014 | Augendre et al. | | |
| 8,871,607 B2 | 10/2014 | Signamarcheix et al. | | |
| 2001/0019877 A1* | 9/2001 | Miyake | .................... | C30B 19/00 438/481 |
| 2002/0153563 A1* | 10/2002 | Ogura | ................. | H01L 21/7624 257/347 |
| 2003/0077885 A1* | 4/2003 | Aspar | ............... | H01L 21/76254 438/517 |
| 2003/0162367 A1* | 8/2003 | Roche | ............... | H01L 21/76254 438/460 |
| 2003/0164371 A1 | 9/2003 | Bergstrom et al. | | |
| 2004/0115477 A1* | 6/2004 | Nesbitt | ................. | A47J 36/025 428/692.1 |
| 2004/0121558 A1* | 6/2004 | Letertre | .............. | H01L 21/2258 438/459 |
| 2004/0171232 A1* | 9/2004 | Cayrefourcq | ..... | H01L 21/76254 438/458 |
| 2004/0180518 A1* | 9/2004 | Chang | .................... | B32B 37/00 438/487 |
| 2004/0241958 A1* | 12/2004 | Guarini | ............... | H01L 21/6835 438/455 |
| 2005/0003229 A1* | 1/2005 | Bedell | ................. | H01L 21/7624 428/641 |
| 2005/0048738 A1* | 3/2005 | Shaheen | ................ | B23K 26/18 438/458 |
| 2005/0148163 A1* | 7/2005 | Nguyen | ............ | H01L 21/76254 438/514 |
| 2006/0024917 A1* | 2/2006 | Henley | ............... | H01L 21/2007 438/455 |
| 2006/0270187 A1* | 11/2006 | Kerdiles | ........... | H01L 21/76254 438/455 |
| 2006/0292845 A1* | 12/2006 | Chiang | ............. | H01L 21/32051 438/597 |
| 2007/0122995 A1* | 5/2007 | Henley | ................. | B81C 1/0038 438/455 |
| 2008/0241982 A1* | 10/2008 | Lee | ......................... | H01L 33/14 438/47 |
| 2008/0296724 A1* | 12/2008 | Yamazaki | ......... | H01L 21/76254 257/506 |
| 2009/0179160 A1 | 7/2009 | Tsukamoto et al. | | |
| 2009/0183825 A1* | 7/2009 | Sato | ........................ | B32B 37/00 156/273.3 |
| 2009/0191719 A1* | 7/2009 | Dupont | ............. | H01L 21/02032 438/779 |
| 2010/0178749 A1* | 7/2010 | Faure | ................. | H01L 21/76254 438/458 |
| 2010/0190000 A1* | 7/2010 | Faure | ................. | H01L 21/76254 428/336 |
| 2010/0221891 A1* | 9/2010 | Fournel | ............ | H01L 21/76254 438/458 |
| 2011/0156212 A1* | 6/2011 | Arena | ................... | H01L 21/187 257/615 |
| 2011/0306180 A1* | 12/2011 | Prabhakar | ............. | H01L 21/268 438/458 |
| 2012/0111829 A1 | 5/2012 | Deguet et al. | | |
| 2012/0161291 A1* | 6/2012 | Bruel | ...................... | C30B 29/06 257/618 |
| 2012/0199956 A1* | 8/2012 | Lecomte | ........... | H01L 21/76254 257/629 |
| 2013/0072009 A1* | 3/2013 | Bruel | .................... | H01L 21/762 438/530 |
| 2013/0156989 A1* | 6/2013 | Moriceau | .......... | H01L 21/76254 428/64.1 |
| 2015/0187638 A1* | 7/2015 | Bruel | .................. | H01L 51/5024 438/458 |
| 2016/0071933 A1 | 3/2016 | Maitrejean et al. | | |
| 2016/0126215 A1* | 5/2016 | Imbert | ................. | H01L 21/187 438/457 |

OTHER PUBLICATIONS

French Preliminary Search Report dated Apr. 4, 2014 in Patent Application No. FR 1356213.

International Search Report and Written Opinion dated Aug. 1, 2014 in PCT/EP2014/063665.

H. Moriceau, et al., "Smart Cut™: Review on an attractive process for innovative substrate elaboration", Elsevier—Nuclear Instruments and Methods in Physics Research B, vol. 277, XP002721940, Apr. 15, 2012, pp. 84-92.

Kenneth Diest, et al., "Silver diffusion bonding and layer transfer of lithium niobate to silicon", Applied Physics Letters, vol. 93, 2008, pp. 092906-1-092906-3.

Young-Bae Park, et al., "Integration of Single-Crystal LiNbO3 Thin Film on Silicon by Laser Irradiation and Ion Implantation-Induced Layer Transfer" Advanced Materials, vol. 18, Jun. 2006, pp. 1533-1536.

* cited by examiner

METHOD FOR TRANSFERRING A THIN LAYER WITH SUPPLY OF HEAT ENERGY TO A FRAGILE ZONE VIA AN INDUCTIVE LAYER

TECHNICAL DOMAIN

The domain of the invention is the production of structures requiring the input of thermal energy to an assembly composed of a first substrate and a second substrate that have different coefficients of thermal expansion.

The invention more precisely relates to the transfer of a thin layer from a first substrate to a second substrate with a coefficient of thermal expansion different from that of the first substrate, in which thermal energy is added to cause partial or complete fracture of the first substrate at a weakened zone.

STATE OF PRIOR ART

The Smart Cut™ technology is a well-known technique for the transfer of thin films of materials, for example semiconducting materials, or at least partially crystalline materials.

In this thin film transfer process, ion species such as hydrogen or helium are implanted in a substrate B in order to form a zone of weakness in it. The substrate B is then put into contact with a substrate A, for example by direct bonding.

The method uses pressurization of extended defects generated during implantation, therefore requiring an energy input into the implanted species in order to transform them into a gas phase.

This energy is usually added by a heat treatment applied to the entire structure composed of the implanted substrate B and the substrate A onto which it is assembled.

In the case of a heterostructure (assembly of two substrates A, B with different natures of physico-thermal properties, particularly a difference in the coefficient of thermal expansion), the global application of a heat budget generates a natural process of expansion of the two substrates that tends to operate differently because the coefficients of expansion of each are not identical.

High stresses are generated in the heterostructure because the substrates are assembled but are not free to expand independently. This stress can reach extremely high levels and often causes excessive strains or even the heterostructure breaking completely, so that the required structure cannot be achieved (substrate A with film transferred from substrate B).

In order to extend the use of the Smart Cut™ technology to heterostructures, it has been proposed that the two substrates can be assembled at high temperature through a diffusion bond layer in order to minimise the stress change at the fracture (for example see the article by K. Diest et al. entitled "Silver diffusion bonding and layer transfer of lithium niobate to silicon", Appl. Phys. Lett. 93, 092906 (2008)). It has also been proposed that energy can be added to the implanted species by means of laser irradiation, preferably absorbed in the implanted zone (see the article by Y.-B. Park et al. entitled «Integration of Single-Crystal LiNbO3 Thin Film on Silicon by Laser Irradiation and Ion Implantation—Induced Layer Transfer", Advanced Materials, Volume 18, Issue 12, pages 1533-1536, June, 2006). However each of these approaches has disadvantages; assembly at high temperature causes stresses in the transferred film at ambient temperature, while laser annealing obtained by short pulse sweeps can cause crystalline damage and also an increase in the roughness of the surface of the transferred film.

Therefore a need remains to find a method that can be used to transfer thin films, for example by Smart Cut™, from substrates with different physico-thermal properties while limiting the thermal expansion of materials and therefore preventing excessive deformation or even breakage of the heterostructure.

PRESENTATION OF THE INVENTION

The purpose of the invention is to satisfy this need and to disclose a method of transferring a thin layer from a first substrate with a first coefficient of thermal expansion to a second substrate with a second coefficient of thermal expansion different from the first coefficient of thermal expansion, the first substrate comprising a weakened zone delimiting the thin layer and a solid part of the first substrate, the method comprising steps to:
bring the first substrate into contact with the second substrate;
fracture the first substrate at the weakened zone making use of input of thermal energy at the weakened zone;
characterised by:
the supply of at least one intermediate layer to the surface of at least one of the first and second substrates before said contact is made, the temperature of the at least one intermediate layer being increased by induction when an electromagnetic field is applied to it, more than temperature increase in the first and second substrates, respectively;
contact is made with the at least one intermediate layer interposed between the first substrate and the second substrate;
said input of thermal energy is made at the weakened zone by the application of an electromagnetic field to the heterostructure formed by making contact between the first substrate and the second substrate.

Some preferred but non-limitative aspects of the method are as follows:
the intermediate layer is made from a material that has a dissipated power density at least 100 times higher, and preferably at least 1000 times higher than the dissipated power density of the material of the first and the second substrates, respectively, when said materials in the intermediate layer and the first and the second substrates are subjected to an electromagnetic field;
the input of thermal energy at the weakened zone leads to fracture of the first substrate at the weakened zone;
the input of thermal energy at the weakened zone leads to weakening of the first substrate at the weakened zone, and the method also includes an additional input of mechanical and/or thermal energy to cause fracture of the first substrate at the weakened zone;
during said input of thermal energy, at least one of the first and second substrates is formed on a temperature controlled chuck;
contact is made by direct bonding of the first substrate and the second substrate;
the intermediate layer is provided on the surface of the first and the second substrates, and the first substrate is bonded to the second substrate through the intermediate layer acting as a bonding layer;
before making contact, it includes formation of a thermal insulation layer on the at least either the first substrate or the second substrate such that after contact is made, the thermal insulation layer is interposed between the intermediate layer and the second substrate;

the intermediate layer is a metal layer, for example a copper layer;

the first substrate is made from LiNbO3 and the second substrate is made from Si;

the electromagnetic field applied to the heterostructure to make said input of thermal energy to the weakened zone is a pulsed electromagnetic field.

BRIEF DESCRIPTION OF THE DRAWINGS

Other aspects, purposes, advantages and characteristics of the invention will become clear after reading the following detailed description of preferred embodiments, given as non-limitative examples, with reference to the appended drawings on which.

DETAILED PRESENTATION OF PARTICULAR EMBODIMENTS

Figure 1A:
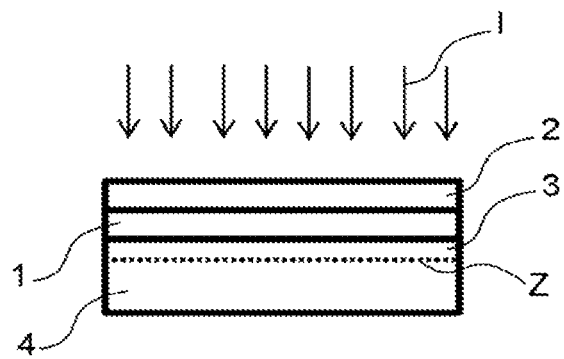
FIGS. 1a-1c diagrammatically show the steps of a possible embodiment of the method according to the invention.
Figure 1B:
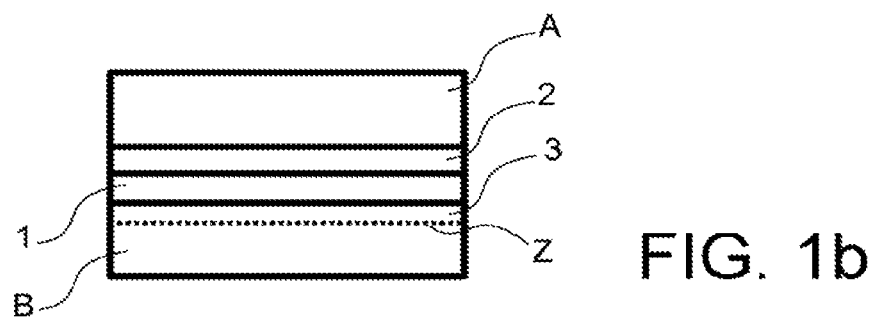
Figure 1C:
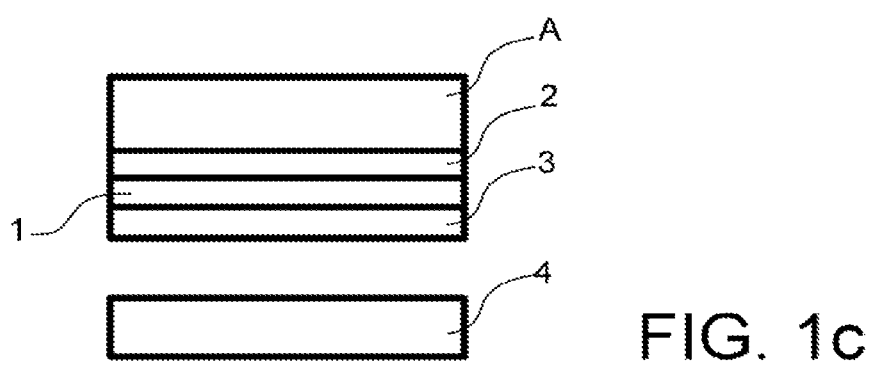

With reference to FIGS. 1a-1c, the invention relates to a method of transferring a thin layer 3 from a first substrate B with a first coefficient of thermal expansion to a second substrate A with a second coefficient of thermal expansion different from the first coefficient of thermal expansion, typically by at least 10% or 20% at ambient temperature.

For example, the invention relates to the transfer of a thin layer from a substrate made from lithium niobate onto a silicon substrate. At ambient temperature (20° C.), the coefficient of thermal expansion of silicon is $3 \times 10^{-6} °C^{-1}$ while the coefficient of thermal expansion of lithium niobate is of the order of 5 to 7 times higher than that of silicon, depending on which axis is considered.

The method according to one possible embodiment of the invention comprises a first step in which at least one intermediate layer is supplied on the surface of at least either the first or the second substrates. With reference to FIG. 1a, the intermediate layer 1 is formed for example on the first substrate B.

The intermediate layer 1 may be a layer deposited on either or both of the substrates A, B, for example by Physical Vapour Deposition (PVD). The thickness of the intermediate layer 1 is typically less than 10 μm.

The intermediate layer 1 is a layer sensitive to electromagnetic actions, typically a metal layer, for example a copper layer. The temperature of the intermediate layer is thus increased by induction when a magnetic field is applied to it, more than the temperature increase in the first and the second substrates respectively.

The intermediate layer 1 may for example be made from a material with a dissipated power density (expressed in W/m$^3$) at least 100 times, and preferably at least 1000 times higher than the dissipated power density in the material of the first and the second substrates respectively, when said materials in the intermediate layer and the first and second substrates are subjected to the same electromagnetic field, particularly at the same working frequency.

Refer to the table in FIG. 4 in patent application US 2003/0164371 A1 to see examples of power densities dissipated for different types of materials. In particular, as purely illustrative examples, the power density of silicon or germanium (with an n-type doping level of the order of $10^{15}/cm^3$) is of the order of 10 000 times lower than that for aluminium or copper. These materials are thus perfectly suitable for implementation of the invention.

As shown in FIG. 1b, the method comprises a second step in which the first substrate B and the second substrate A are brought into contact with the at least one intermediate layer 1 interposed between them. Contact may particularly lead to direct bonding of the substrates, in other words bonding that does not require the addition of a bonding layer (such as glue, etc.) and that may or may not include an input of thermal energy.

A heterostructure is obtained after making this contact, in the sense that the two substrates A, B have different physico-thermal properties, particularly a difference in the coefficient of thermal expansion.

In one possible embodiment shown in FIGS. 1a-1c, the method includes a step in which a thermal insulation layer 2 is formed on at least either the first substrate B or the second substrate A before contact is made between substrates A, B, such that after contact is made (see FIG. 1b) the thermal insulation layer 2 is interposed between the intermediate layer 1 and the first substrate A.

As can be seen in FIG. 1a, the intermediate layer and the thermal insulation layer may both be formed on the first substrate B. A thermal insulation layer may then also be formed on the second substrate A. As a variant, the thermal insulation layer and the intermediate layer may be formed on the second substrate A. Or also, the intermediate layer may be formed on the first substrate while the thermal insulation layer is formed on the second substrate.

The thermal insulation layer may for example be a silicon dioxide SiO$_2$ layer.

The method also comprises a step, before contact, made to form a weakened zone Z within the thickness of the first substrate B. The weakened zone delimits a thin surface layer 3 and a solid part 4 in the first substrate B. As shown in FIG. 1a, the weakened zone Z may be formed by implantation of species I in the first substrate B. The weakened zone Z is located at a distance equal to between 30 nm and 2 μm from the intermediate layer.

After contact is made, the method comprises the addition of energy at the weakened zone to fracture the first substrate B at the weakened zone, and consequently transfer the thin layer 3 from the first substrate B to the second substrate A as shown in FIG. 1c.

The composite substrate (thin layer on intermediate layer on substrate A) obtained after transfer can be used in radiofrequency applications in which the intermediate metal layer acts as a buried metal electrode, or also in power applications with a buried metal electrode.

Unlike conventional methods in which this input of energy is made fully or partly by a heat treatment applied to the entire heterostructure obtained by making contact, the invention discloses creation of an indirect local temperature rise in the heterostructure in order to provide the implanted species with the energy necessary to generate a gas phase and thus increase the pressure in microdefects resulting from implantation without affecting the entire heterostructure.

Thus, within the framework of the invention, such an input of thermal energy is provided by application of a magnetic field to the heterostructure formed by making contact between the first substrate and the second substrate, said application generating induction heating located at the intermediate layer that induces thermal diffusion towards the weakened zone, thus providing said input of thermal energy at the weakened zone.

The electromagnetic field is typically applied by means of a current loop surrounding the heterostructure, for example a copper loop through which an electric current passes to produce the electromagnetic field that will induce local induction heating in the intermediate layer. The current loop may particularly be in the form of an open torus, the heterostucture being located within the opening of the torus.

The intermediate layer thus acts as a local heat source, the maximum temperature increase being observed in this layer. A temperature gradient is then created in the heterostructure for which the local value at the implanted zone will activate the fracture mechanism. This temperature gradient can allocate all or some of the heat budget necessary for the fracture phenomenon to the weakened zone while limiting the temperature increase in the remaining part of the heterostructure. Thermal expansion of substrates A, B is thus limited, which limits strain and prevents breakage of the heterostructure.

In one embodiment, this supply of thermal energy at the weakened zone by application of an electromagnetic field to the heterostructure leads to fracture of the first substrate at the weakened zone. In another embodiment, this input of thermal energy leads to weakening of the first substrate at the weakened zone, and additional mechanical and/or thermal energy is added to lead to fracture of the first substrate at the weakened zone. This additional energy input is preferably made after thermal energy has been supplied by induction.

It should be noted that when the intermediate layer is used as a bonding layer during the step in which contact is made (an intermediate layer being previously formed for this purpose on each of the first and second substrates), application of the magnetic field can strengthen bonding, not only due to the thermal effect related to heating of the intermediate layer, but also by circulation of induced electric currents that contribute to closing the bonding interface by electro-migration.

Figure 2:
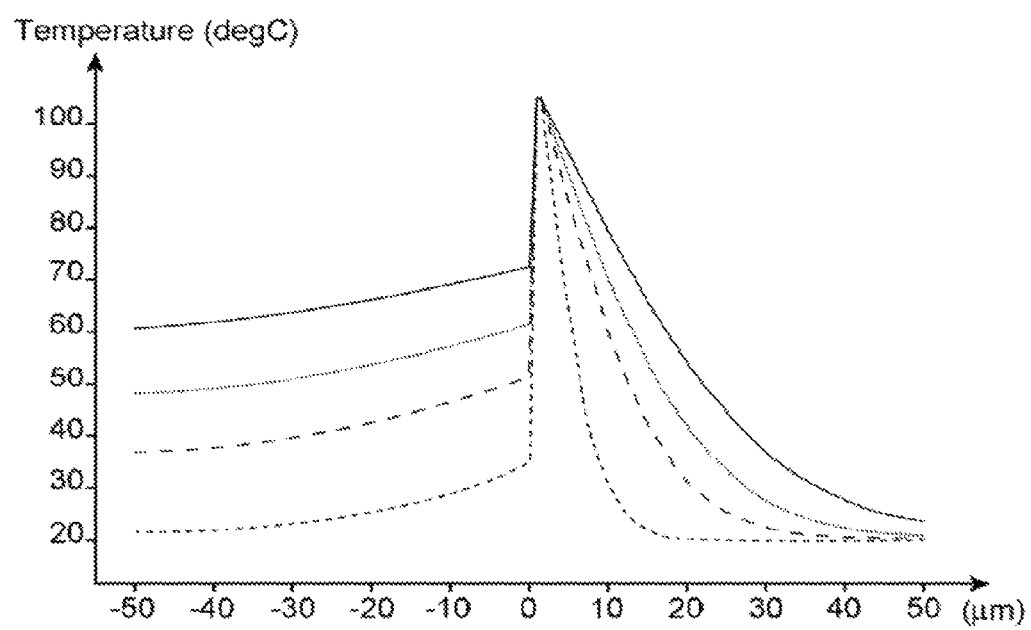
FIG. 2 shows thermal diffusion in an example heterostructure of the method according to the invention.

The presence of a thermal insulation layer 2 is advantageous in that this layer 2 favors thermal diffusion on only one side of the intermediate layer 1, the thermal gradient generated by the induction phenomenon then being in the form of an asymmetric Gaussian profile. FIG. 2, that shows simulation results under stationary conditions, provides four examples of this type of asymmetric diffusion depending on the degree of heating generated in the intermediate layer by different applications of magnetic field. In this FIG. 2, the "0" position separates an Si substrate (at the left) from a 1 μm thick SiO2 thermal insulation layer followed by an intermediate copper layer and then a second substrate B made from lithium niobate (at the right), the abscissa axis showing the deviation at this "0" position expressed in micrometers.

In one embodiment, during said supply of thermal energy by induction, at least either the first or the second substrate is arranged on a temperature controlled chuck, particularly to cool the back face of the first and/or second substrates and thus limit the increase in temperature within the first and/or second substrates.

In one embodiment, the magnetic field applied to the heterostructure to make the said input of thermal energy to the weakened layer is a pulsed electromagnetic field. This increases the temperature differential between the vicinity of the weakened zone and the remainder of the heterostructure, particularly when the substrates do not have the same thermal time constant, as is the case for example for silicon and lithium niobate substrates.

Figure 3A:
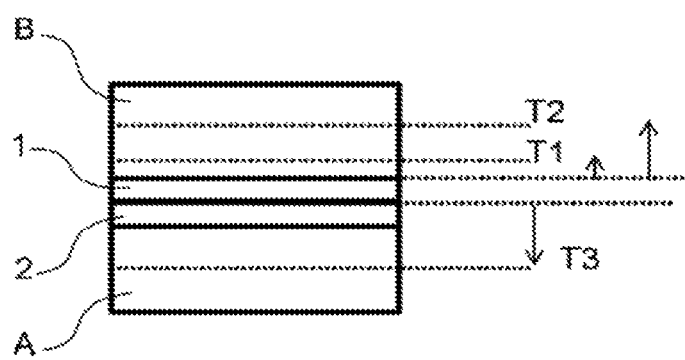
FIGS. 3a and 3b are diagrams illustrating the temperature increase at different points of an example heterostructure of the method according to the invention.
Figure 3B:
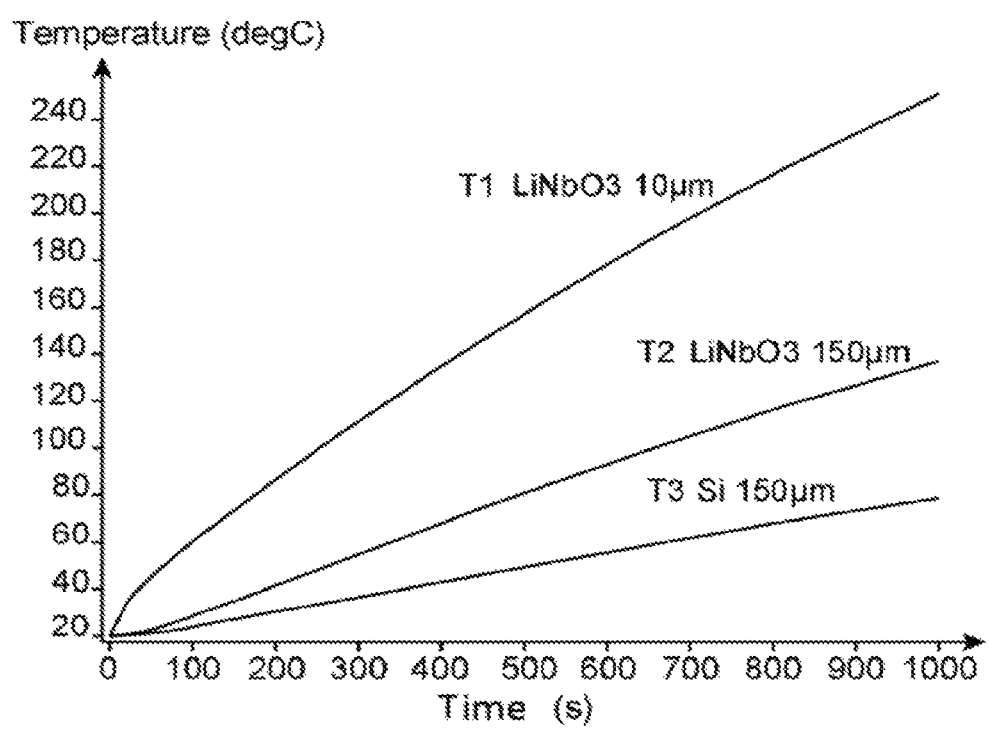

FIGS. 3a and 3b are diagrams showing the increase in temperature at different points of an example heterostructure formed by the assembly of a first 250 μm thick 50 mm diameter substrate B made from lithium niobate LiNbO3 with a second 250 μm thick 50 mm diameter substrate A made from silicon Si through a 10 μm thick intermediate copper layer 1 and a 10 μm thick $SiO_2$ thermal insulation layer 2.

The magnetic field is applied in the ambient environment, using a water cooled copper loop, with a radius of 5 mm, with a power of the order of 7 kW, a current of 34 A and a frequency of 500 kHz.

FIG. 3b shows the temperature increase as a function of the duration of the electromagnetic excitation at different points of the heterostructure in FIG. 3a, namely in the first substrate B at T1=10 μm from the intermediate layer 1 and at T2=150 μm from the intermediate layer, and in the second substrate A at T3=150 μm from the intermediate layer 1. It should be observed particularly that after about 100 seconds of electromagnetic excitation, the temperature at T2 and T3 does not exceed 27° C. while the temperature at T1 reaches 60° C. The temperature difference between the two substrates is thus low, while a relatively high temperature increase is observed close to the intermediate layer.

A substrate made from lithium niobate implanted with helium at a dose of $10^{17}/cm^2$ is conventionally fractured by a global heat treatment at 70° C. for a few hours. The weakened zone is typically located at 1 μm from the intermediate layer, the high temperature increase close to the intermediate layer achieved in the framework of the invention thus being used to cause the fracture, remembering that the kinetics of the fracture phenomenon respects an Arrhenius law in which the activation energy for lithium niobate is estimated at 1.3 eV (fracture about 1000 times faster every 70° C.).

The invention claimed is:

1. A method of transferring a thin layer from a first substrate with a first coefficient of thermal expansion to a second substrate with a second coefficient of thermal expansion different from the first coefficient of thermal expansion, the first substrate comprising a weakened zone delimiting the thin layer and a solid part of the first substrate, the method comprising:
    bringing the first substrate into contact with the second substrate;
    fracturing the first substrate at the weakened zone by making use of supply of thermal energy at the weakened zone;
    providing at least one intermediate layer to a surface of at least one of the first and second substrates before the contact is made with the at least one intermediate layer interposed between the first substrate and the second substrate, a temperature of the at least one intermediate layer being increased by induction when an electromagnetic field is applied to it;
    applying an electromagnetic field to a heterostructure formed by the contact made between the first substrate and the second substrate, the applying generating a localized induction heating at the at least one intermediate layer, said localized induction heating inducing a thermal diffusion towards the weakened zone that provides said supply of thermal energy at the weakened zone, wherein, the temperature increase of the at least one intermediate layer is greater than a temperature increase in the first and second substrates respectively, and during the application of the electromagnetic field, no additional heat energy is applied to the heterostructure.

2. The method according to claim 1, wherein the at least one intermediate layer is made from a material that has a dissipated power density at least 100 times higher than a dissipated power density of the material of the first and the second substrates, respectively, when the materials in the intermediate layer and in the first and the second substrates are subjected to an electromagnetic field.

3. The method according to claim 1, wherein said supply of thermal energy at the weakened zone by application of the electromagnetic field to the heterostructure leads to fracture of the first substrate at the weakened zone.

4. The method according to claim 1, wherein said supply of thermal energy at the weakened zone by application of the electromagnetic field to the heterostructure leads to weakening of the first substrate at the weakened zone, and the method further comprises an additional supply of mechanical and/or thermal energy to cause fracture of the first substrate at the weakened zone.

5. The method according to claim 1, further comprising forming the weakened zone by implantation of species in a thickness of the first substrate.

6. The method according to claim 1, wherein during the supply of thermal energy, at least one of the first and second substrates is disposed on a temperature controlled chuck.

7. The method according to claim 1, wherein the contact is made by direct bonding of the first substrate and the second substrate.

8. The method according to claim 7, wherein the at least one intermediate layer is provided on the surface of the first and the second substrates, and the first substrate is bonded to the second substrate through the intermediate layer acting as a bonding layer.

9. The method according to claim 1, further comprising, before bringing the first substrate into contact with the second substrate, forming a thermal insulation layer on at least either the first substrate or the second substrate such that, after contact is made, the thermal insulation layer is interposed between the intermediate layer and the second substrate.

10. The method according to claim 1, wherein the intermediate layer is a metal layer.

11. The method according to claim 1, wherein the intermediate layer is a copper layer.

12. The method according to claim 1, wherein the first substrate is made from LiNbO3 and the second substrate is made from Si.

13. The method according to claim 1, wherein the electromagnetic field applied to the heterostructure to make the supply of thermal energy to the weakened zone is a pulsed electromagnetic field.

14. The method according to claim 5, wherein the first substrate is a lithium niobate substrate and the implanted species is helium.

* * * * *